United States Patent
Busson et al.

(10) Patent No.: US 7,106,808 B2
(45) Date of Patent: Sep. 12, 2006

(54) TUNER OF THE TYPE HAVING ZERO INTERMEDIATE FREQUENCY AND CORRESPONDING CONTROL PROCESS

(75) Inventors: Pierre Busson, Grenoble (FR); Pierre-Olivier Jouffre, Grenoble (FR); Frédéric Paillardet, Aix les Bains (FR)

(73) Assignee: STMicroelectronics SA, Montrouge (FR)

( * ) Notice: Subject to any disclaimer, the term of this patent is extended or adjusted under 35 U.S.C. 154(b) by 1148 days.

(21) Appl. No.: 09/827,306

(22) Filed: Apr. 5, 2001

(65) Prior Publication Data

US 2002/0003586 A1    Jan. 10, 2002

(30) Foreign Application Priority Data

Apr. 21, 2000    (FR) .................. 00 05142

(51) Int. Cl.
  *H03K 9/00* (2006.01)
(52) U.S. Cl. ...................... 375/316; 375/345
(58) Field of Classification Search .......... 375/316, 375/326, 327, 340, 344, 345; 455/239.1, 455/240.1, 241.1, 242.1, 245.1, 245.2, 250.1, 455/244.1
  See application file for complete search history.

(56) References Cited

U.S. PATENT DOCUMENTS

| | | | |
|---|---|---|---|
| 5,485,486 A * | 1/1996 | Gilhousen et al. | 370/335 |
| 5,550,869 A * | 8/1996 | Gurantz et al. | 375/340 |
| 5,655,220 A * | 8/1997 | Weiland et al. | 455/69 |
| 5,732,341 A * | 3/1998 | Wheatley, III | 455/234.1 |
| 6,011,980 A * | 1/2000 | Nagano et al. | 455/572 |
| 6,181,201 B1 * | 1/2001 | Black | 330/129 |
| 6,208,849 B1 * | 3/2001 | Cho et al. | 455/296 |
| 6,321,073 B1 * | 11/2001 | Luz et al. | 455/239.1 |
| 6,324,387 B1 * | 11/2001 | Kamgar et al. | 455/234.1 |
| 6,434,186 B1 * | 8/2002 | Dowling | 375/147 |
| 6,442,380 B1 * | 8/2002 | Mohindra | 455/234.1 |
| 6,459,889 B1 * | 10/2002 | Ruelke | 455/296 |
| 6,477,196 B1 * | 11/2002 | Swanke et al. | 375/147 |
| 6,498,926 B1 * | 12/2002 | Ciccarelli et al. | 455/240.1 |
| 6,498,929 B1 * | 12/2002 | Tsurumi et al. | 455/296 |
| 6,516,185 B1 * | 2/2003 | MacNally | 455/234.1 |
| 6,748,200 B1 * | 6/2004 | Webster et al. | 455/234.1 |

FOREIGN PATENT DOCUMENTS

| | | |
|---|---|---|
| EP | 0413311 | 2/1991 |
| EP | 0657997 | 6/1995 |

\* cited by examiner

*Primary Examiner*—Emmanuel Bayard
(74) *Attorney, Agent, or Firm*—Lisa K. Jorgenson; Allen, Dyer, Doppelt, Milbrath & Gilchrist, P.A.

(57) ABSTRACT

A tuner includes an analog block, a digital block, and an analog/digital conversion stage connected therebetween. The analog block includes a first attenuator/controlled-gain amplifier stage connected upstream to a frequency transposition stage. The overall mean power of the entire signal received by the tuner is calculated during a phase of initialization. This overall calculated power is compared in the digital block with a first predetermined reference value corresponding to a maximum power desired at a predetermined location of the analog block. The gain of the first attenuator/amplifier stage is adjusted to minimize the deviation between the overall calculated power and the reference value. In a phase of normal operation, one of the channels of the signal received is selected, with the gain of the first attenuator/amplifier stage being fixed.

47 Claims, 2 Drawing Sheets

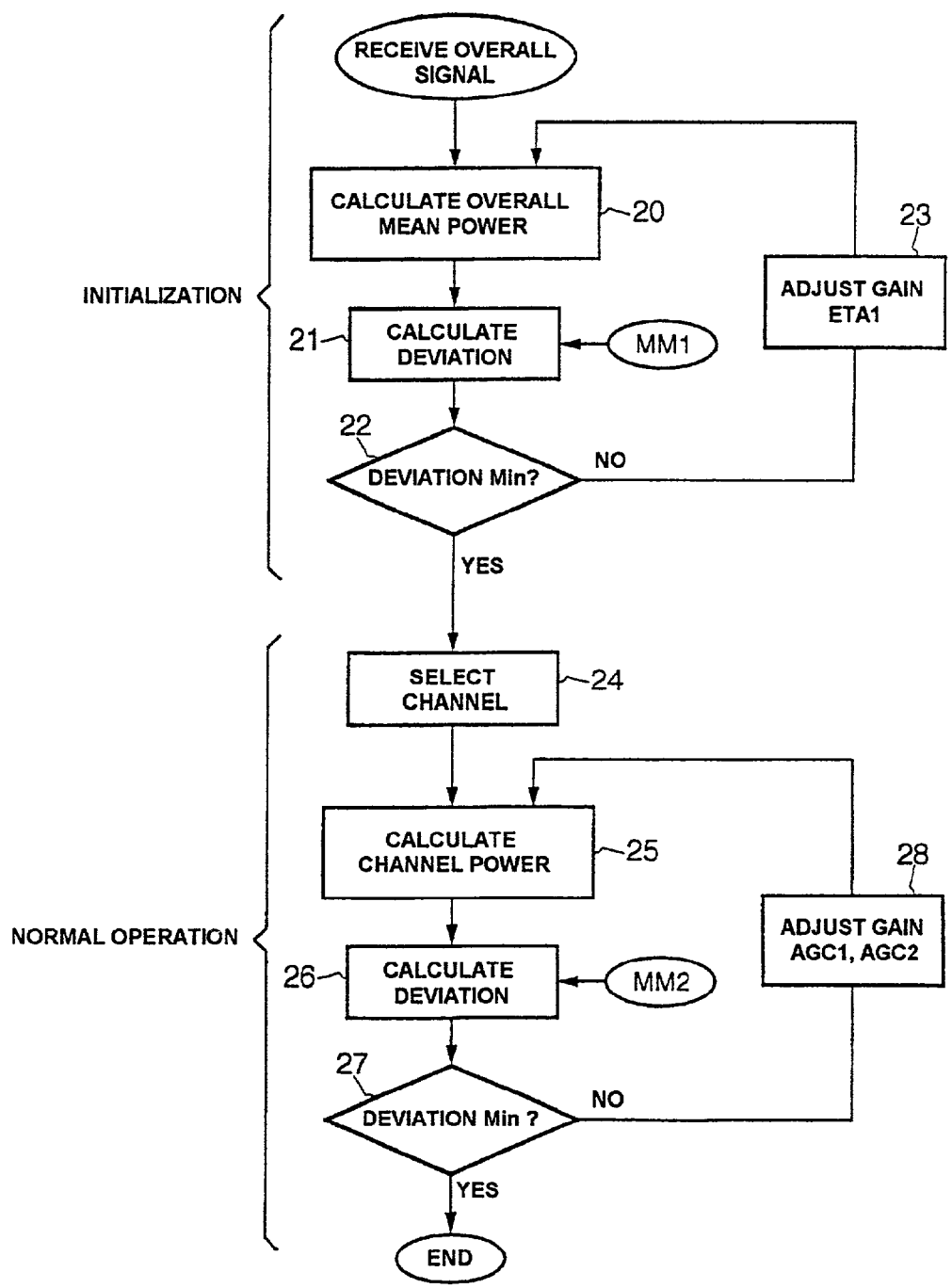

TUNER OF THE TYPE HAVING ZERO INTERMEDIATE FREQUENCY AND CORRESPONDING CONTROL PROCESS

FIELD OF THE INVENTION

The present invention relates to the decoding of a radio frequency transmission channel conveying coded digital information, and applies advantageously, but not limitingly, to satellite-based digital telebroadcasting. Satellite-based digital telebroadcasting may be defined in the Digital Video Broadcasting-satellite (DVB-S) European specification based on the MPEG compression standards, and uses quadrature digital modulation to convey the information, for example. The invention thus relates more particularly to tuners, and in particular, to a tuner of the type having a zero intermediate frequency, such as, for example, those incorporated into satellite receivers with decoders for compressed image data, otherwise known as set-top boxes.

BACKGROUND OF THE INVENTION

The television signals originating from a satellite are amplified and converted into a predetermined frequency band, typically 950 MHZ to 2,150 MHZ, by way of a parabolic dish and a low-noise converter located at the focus of the parabolic dish. This signal is then dispatched to the input of the tuner of the receiver. The purpose of the tuner is to select the desired channel and to output a baseband signal on the in-phase path (I path) and on the quadrature path (Q path). This signal is then converted into a digital signal and demodulated.

The channel decoding processing also comprises a block which distinguishes the zeros from the ones, typically by means of majority logic, then performs the entire error correction. Error correction may typically be Viterbi decoding, deinterlacing, Reed-Solomon decoding and deshuffling. The channel decoding device outputs packets which are decoded in a conventional manner in a source decoding device in accordance with the MPEG standards to redeliver at the output, the initial audio and video signals transmitted via the satellite.

At the input of the receiver, the signal received is composed of the collection of channels which are transmitted from the satellite and are transposed into the 950 MHZ to 2,150 MHZ frequency band. The overall power received is substantially equal to the mean power on a channel increased by ten times the Napierian logarithm of the number of channels. This signal possesses a considerable variation on the order of 50 dBm.

At present, in receivers as a whole, the signal received at the input is normally filtered by a wide band type filter, whose passband is on the order of several hundred MHZ, which is placed just after the low-noise input amplifier. This is done to avoid the saturation of the subsequent stages of the tuner, especially the controlled-gain amplification stages as well as the mixers of the frequency transposition stage.

Furthermore, current approaches provide for the low-noise input amplifier and the wide band filters to be made external from the chip containing the controlled-gain amplifying stage as well as the frequency transposition stage. These filters, whose cut-off frequencies can be tailored by selecting the desired channel, are then embodied as discrete components, such as varicap diodes. Such components, are of an overly large size which is incompatible with a fully integrated embodiment of the tuner.

SUMMARY OF THE INVENTION

In view of the foregoing background, an object of the present invention is to provide a tuner which can be fully embodied in an integrated fashion on a silicon substrate, while avoiding saturation of the various elements of the tuner.

The invention therefore proposes a process for controlling a tuner of a type having a zero intermediate frequency. The tuner comprises an analog block containing a first attenuator/controlled-gain amplifier stage connected upstream of a frequency transposition stage containing baseband filters, and a digital block connected to the analog block by an analog/digital conversion stage.

According to a general characteristic of the invention, the control process comprises a phase of initialization in which the overall mean power of the entire signal received by the tuner is calculated. This overall calculated power is compared in the digital block with a first predetermined reference value corresponding to a maximum power desired at a predetermined location of the analog block. This predetermined location may be at the input of the mixers of the frequency transposition stage, for example. The gain of the first attenuator/amplifier stage is then adjusted to minimize the deviation between the overall calculated power and the reference value. The control process according to the invention furthermore comprises a phase of normal operation in which one of the channels of the signal received is selected, while the gain of the first attenuator/amplifier stage is fixed.

In a general manner, it is possible to calculate the overall mean power of the entire signal received by the tuner on the basis of any signal available in the analog block upstream of the first filter of this analog block. Thus, when the mixers of the frequency transposition stage are not equipped with filters, the first filtering encountered in the analog block is the baseband filter.

In this case, it would therefore be possible to use any signal tapped off upstream of this baseband filter. Generally, the mixers used in a frequency transposition stage of a tuner intrinsically include a filter. In this case, an analysis of the overall power of the signal received is carried out before the mixers. These elements are the last of the analog reception chain receiving all the power from various channels. It is preferable, in particular, to use the signal available between the output of the first attenuator/amplifier stage and the input of the frequency transposition stage, for design reasons.

According to an implementation of the process according to the invention, the calculation of the overall mean power of the entire signal received is performed in the digital block, i.e., downstream of the analog/digital conversion stage. This calculation of the overall mean power then comprises, for example, a calculation of the modulus of the sampled signal as well as a numerical integration over a certain number of samples, typically $2^{21}$. It would be possible as a variation to provide an integrating analog filter in the analog block intended to perform the averaging of the analog signal on the basis of which one wishes to calculate the overall mean power.

Next, the output signal from the filter (voltage), representative of the overall mean power of the signal received, would then be sampled in the analog/digital conversion stage. In theory, it would be necessary to use only a single sample to perform the comparison with the reference value. However, in practice, this comparison would be performed with a mean value calculated over a very limited number of samples, such as three or four, for example.

The process according to the invention is also particularly advantageous when the analog block of the tuner furthermore comprises a second controlled-gain amplifier stage connected downstream of the baseband filter. In this case, according to one mode of implementation of the process, the mean power of the selected channel is calculated in the phase of normal operation. This calculated mean power of the channel is compared in the digital block with a second predetermined reference value corresponding to a maximum desired channel power at the input of the analog/digital conversion stage. The gain of the second amplifier stage is adjusted to minimize the deviation between the calculated channel power and the second reference value.

Stated otherwise, after the initialization phase, the signal is switched to the mixers of the frequency transposition stage, and the second controlled-gain amplification stage integrated into the baseband filter allows fine adjustment of the level at the input of the converter to have a power corresponding to the maximum dynamic range of the analog/digital conversion stage.

The fact, according to the invention, of calculating in an initialization phase the overall power of the signal received and of adjusting the gain of the first attenuator/controlled-gain amplifier stage, then adjusting the gain of the second amplifier stage in the phase of normal operation allows better balancing between the control of the gains of the two controlled-gain amplifier stages.

Specifically, in the prior art approaches, providing wide-band external filters with discrete components, which can be controlled as a function of the selecting of the desired channel, there is no initialization phase in which the overall power of the entire signal received is calculated. The power of the signal is in fact calculated at the output of the analog block. This is after analog/digital conversion on a filtered signal comprising, apart from the selected channel, the immediately adjacent channels.

Also, it is on the basis of this single power calculation that the gains of the various controlled-gain amplifier stages are adjusted. The drawback of this approach resides in the fact that one then possesses only a single information source relating to the reception power on the tuner, and that this information is located at the output of the analog chain. Also, this information is already filtered and therefore possesses only a part of the input signal, namely the desired channel and possibly the adjacent channels. The accuracy of adjustment of the various controlled-gain amplifiers is therefore less accurate than that used in the present invention. Two different calculations of power are used according to the present invention, i.e., in the initialization phase and in the phase of normal operation, so as to independently adjust the gains of the two controlled-gain amplifying stages.

Furthermore, if it is now assumed that a spurious reception spike is located in the vicinity of the selected channel. The latter will have a strong influence in the calculation of the power performed at the end of the analog chain in the prior art approaches. Consequently, the gain of the first amplifier stage will tend to be minimized to avoid saturation of the subsequent elements. This thereby leads to an increase in the gain of the second amplifier stage to obtain the maximum dynamic range at the input of the analog/digital conversion stage.

In the process according to the invention, the power of the spurious spike is diluted within the overall power of the signal received. This will lead, in the initialization phase, to the adjusting of the first amplifier stage to have a slightly higher gain than in the prior art. Therefore, in the phase of normal operation, the channel power calculation performed at the output of the analog chain will lead to the adjusting of the gain of the second amplifier stage to have a slightly lower gain than in the prior art. A larger margin is therefore obtained with regards to adjusting the gain of the second amplifier together with better balancing in the control of the gains.

The subject of the present invention is also a tuning device of the type having a zero intermediate frequency comprising a signal input, an analog block containing a first attenuator/controlled-gain amplifier stage connected between the signal input and a frequency transposition stage containing a baseband filter, and a digital block connected to the analog block by an analog/digital conversion stage.

According to a general characteristic of the invention, the device comprises controllable means for signal routing incorporated into the analog block for possessing an input terminal connected to the signal input, a first output terminal connected to the input of the baseband filter, and a second output terminal connected directly to the input of the analog/digital conversion stage, first means of calculation, connected to the second output terminal of the routing means, and able to calculate the overall mean power of the entire signal received by the tuner, first means of comparison, incorporated into the digital block, and able to compare this overall calculated power with a first predetermined reference value corresponding to a maximum power desired at a predetermined location of the analog block, first means of adjustment able to adjust the gain of the first attenuator/amplifier stage as a function of the result of the comparison, and means of control able in a phase of initialization to control the routing means in such a way as to connect their input terminal to their second output terminal to minimize the deviation between the overall calculated power and the first reference value, and in a phase of normal operation in the course of which a channel of the signal received is selected, to control the routing means to connect their input terminal to their first output terminal, with the gain of the first attenuator/amplifier stage being fixed.

According to one embodiment of the device, the analog block of the tuner furthermore contains a second controlled-gain amplifier stage connected downstream of the baseband filter. The tuner thus also comprises:

second means of calculation connected to the output of the baseband filtering means and able to calculate in the phase of normal operation the mean power of the selected channel, second means of comparison incorporated into the digital block and able to compare this mean calculated channel power with a second predetermined reference value corresponding to a maximum channel power desired at the input of the analog/digital conversion stage, and second means of adjustment able to adjust the gain of the second amplifier stage to minimize the deviation between the calculated channel power and the second reference value.

Preferably, the signal routing means are disposed between the output of the first attenuator/amplifier stage and the input of the frequency transposition stage. The digital block can incorporate the first means of calculation. The device according to the invention is advantageously embodied entirely in an integrated fashion on a semiconductor substrate.

The invention also provides a receiver for satellite digital television signals, comprising a tuning device such as that defined above.

BRIEF DESCRIPTION OF THE DRAWINGS

Other advantages and characteristics of the invention will be apparent on examining the detailed description of non-limiting embodiments and modes of implementation and, of the appended drawings, in which:

FIG. 2 is a schematic flow chart of the main steps of a control process according to the present invention.

DETAILED DESCRIPTION OF THE PREFERRED EMBODIMENTS

Figure 1:
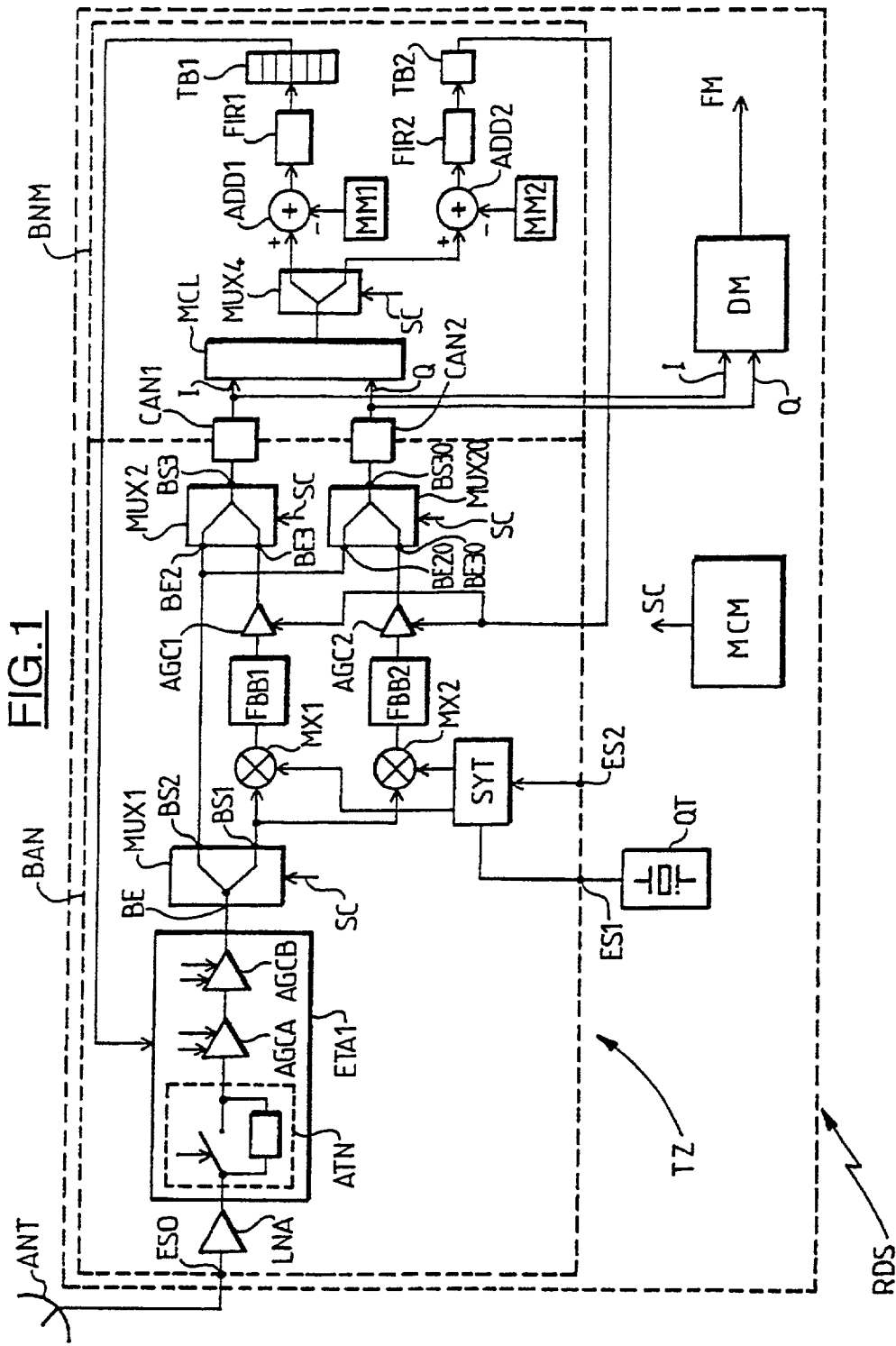
FIG. 1 is a schematic diagram of the internal architecture of a frequency tuning device according to the present invention.

In FIG. 1, the reference RDS denotes a satellite receiver/decoder (set-top box) connected to a parabolic antenna ANT picking up digital television signals for receiving and decoding these signals. This receiver RDS comprises, at the front end, a tuning device or tuner TZ intended for selecting the desired channel from the set of channels present in the signal received at the signal input ES0 of this tuner.

This tuner TZ, embodied entirely in integrated fashion in CMOS technology on a silicon substrate, is of the type with a zero intermediate frequency. That is, it does not perform any transposition of frequencies to an intermediate frequency but includes just a single frequency transposition stage. The single frequency transposition stage comprises the mixers MX1 and MX2, and directly transposes the signal in the vicinity of the baseband of a channel. Stated otherwise, the frequency transposition stage directly delivers the selected channel as well as the immediately adjacent channels.

The tuner TZ comprises at the front end a low-noise amplifier LNA connected to the signal input ES0 and has, for example, a gain of 15 dB. The amplifier LNA is followed by a first attenuator/controlled-gain amplifier stage ETA1. More precisely, this stage ET1 comprises a controllable attenuator block ATN, which has been represented schematically in FIG. 1 by a breaker which is used to shunt the attenuator. This attenuator allows, when it is actuated, a signal attenuation of −20 dB, for example.

The stage ETA1 also comprises, following this attenuator block ATN, two controlled-gain amplifiers AGCA and AGCB. The gain of each amplifier AGCA or AGCB can be adjusted, for example, between three discrete values, namely the values 0 dB, 6 dB and 12 dB, for example. The total gain of the amplifier block composed of the two amplifiers AGCA and AGCD can therefore be controlled in such a way as to take the values 0 dB, 6 dB, 12 dB, 18 dB or 24 dB.

The output of the stage ETA1 is connected to the input terminal BE of a signal routing means formed by a multiplexer MUX1 controlled by a control signal SC. This multiplexer MUX1 comprises a first output terminal BS1 linked to the two mixers MX1 and MX2 of the frequency transposition stage.

These two mixers MX1 and MX2 also receive, in a conventional manner, two quadrature mixing signals from a frequency synthesizer SYT, for example. The frequency of each of the two mixing signals is identical and corresponds to the frequency of the selected channel. The frequency synthesizer SYT is controlled by a selection signal from a selection input ES2 connected to an I²C bus according to terminology readily known by one skilled in the art. Furthermore, the frequency synthesizer is driven by a reference clock signal received on an input ES1 and originating from a quartz QT.

The two processing paths connected to the outputs of the two mixers MX1 and MX2 are quadrature paths, named I and Q respectively according to standard terminology readily known by one skilled in the art. The I path represents the in-phase signal, while the Q path represents the quadrature signal.

The mixers MX1 and MX2 are equipped at the output with low-pass filters, the cut-off frequency of which is on the order of 150 to 250 MHZ. The output signal from the two mixers MX1 and MX2 is therefore a signal centered about the frequency 0 MHZ, extending over a frequency band of 150 to 250 MHZ and including the selected channel as well as the immediately adjacent channels. The width of a channel is on the order of 40 MHZ for high definition digital television signals. The two baseband filters FBB1 and FBB2, which follow the two mixers MX1 and MX2, have a passband on the order of 40 MHZ. Consequently, a filtered signal comprising the selected channel only is recovered at the output of these two baseband filters.

The two baseband filters are followed by a second controlled-gain amplifying stage formed by two controlled-gain amplifiers AGC1 and AGC2. The outputs of the two amplifiers AGC1 and AGC2 are respectively connected to the input terminals BE3 and BE30 of two other multiplexers MUX2 and MUX20 likewise controlled by the control signal SC.

The multiplexer MUX1 also comprises a second output terminal BS2 connected directly to the other two input terminals BE2 and BE20 of the other two multiplexers MUX2 and MUX20. This direct connection path therefore shunts any means of filtering the overall signal. In this instance the filters are present at the input of the mixers MX1 and MX2 as well as the baseband filters FBB1 and FBB2. This direct connection makes it possible, as will be seen in greater detail below, to calculate the overall power of the entire signal received.

The two output terminals BS3 and BS30 of two multiplexers MUX2 and MUX20 are respectively connected to the two inputs of two analog/digital converters CAN1 and CAN2 intended for sampling the analog signals received at their input at a sampling frequency, for example, on the order of 150 MHZ. These two analog/digital converters CAN1 and CAN2 mark the boundary between the analog block BAN of the tuner BZ and the digital block BNM of this tuner.

The two in-quadrature digital signals I and Q delivered by the analog/digital converters are processed in a calculation block MCL which will determine the power of this signal (I, Q) by calculating, for example, the modulus thereof. A simplified way of calculating the modulus of the signal in the block MCL is provided by formula (1):

$$\text{Modulus } (I,Q) = \text{Max}(\text{abs}(I), \text{abs}(Q)) + \tfrac{1}{2} \text{Min}(\text{abs}(I), \text{abs}(Q)) \quad (1)$$

In this formula, Max denotes the maximum value, Min denotes the minimum value and abs denotes the absolute value.

As will be seen in greater detail below, according to the phases of operation of the tuner, the input terminal of the multiplexer MUX1 can be connected either to its first output terminal BS1, or to its second output terminal BS2. Likewise, the output terminals BS3 and BS30 of the multiplexers MUX2 and MUX20 can be correspondingly linked to the output terminals BE2 and BE20 or BE3 and BE30. When a direct connection is effected between the output of the stage ETA1 and the analog/digital converters CAN1 and CAN2, the two signals I and Q are in fact identical signals and are not in-quadrature signals.

Formula (1) above for calculating the modulus therefore simplifies and becomes formula (2) below in which S denotes the signal delivered by the output terminal BS2 of the multiplexer MUX1.

$$\text{Modulus }(S) = \text{Max}(\text{abs}(S)) + \frac{1}{2}\text{Min}(\text{abs}(S)) \tag{2}$$

When the output of the stage ETA1 is connected to the converter CAN1 and CAN2 by way of the frequency transposition stage and of the baseband filters, the two signals I and Q are indeed two in-quadrature signals. The output of the calculation block MCL is linked to a multiplexer MUX4. One of the outputs of which is linked to a subtractor ADD1, and the other output of which is linked to a subtractor ADD2.

When one wishes to calculate the overall mean power of the entire signal received, the multiplexer MUX4 is controlled to deliver the signal arising from the calculation block MCL to the subtractor ADD1. This subtractor ADD1 furthermore receives on its second input a first reference value stored, for example, in a register or a memory MM1. This first reference value corresponds to a maximum power desired at a predetermined location of the analog block, for example, at the input of the mixers of the frequency transposition stage. By way of indication, it will be possible to fix this first reference value at −10 dBm, thereby making it possible to avoid saturation of the elements of the analog block, for example.

Each sample delivered by the calculation block MCL is representative of the instantaneous power of the signal received at the input of this block MCL. The subtractor ADD1 compares the instantaneous power of each sample with the first reference value. These successive comparison values are then temporally integrated in an integrator with programmable coefficients FIR1.

The integration is performed over a sliding window of $2^{21}$ samples and the output of the integrator therefore provides the deviation between the overall mean power of the entire signal received and the first reference value. Consequently, it would also be possible to perform the integration at the output of the block MCL to calculate the mean power of the overall signal, then to subtract the reference value from this mean value. The subtractor would in this case be placed downstream of the integrator.

The output from the integrator FIR1 is then delivered to means for adjusting the gain of the stage ETA1. These adjusting means comprise, for example, a reference table which is decoded by the output of the integrator and will deliver a digital word whose value will make it possible to control the breaker of the attenuator block ATN and to fix the gains of the two amplifiers AGCA and AGCB.

When the input of the multiplexer MUX4 is connected to its other output, which is the one linked to the subtractor ADD2, it will be possible to calculate the mean power of the selected channel and to adjust the gain of the two controlled-gain amplifiers AGC1 and AGC2. In this regard, a register or memory MM2 contains a second reference value corresponding to a maximum channel power desired at the input of the analog/digital conversion stage to obtain the maximum dynamic range at the input of this stage.

This second reference value can be taken equal to 7 dB. The subtractor ADD2 then calculates the deviation between the instantaneous power of each sample of the selected channel and this second reference value. These deviations are then integrated in an integrator FIR2 having a structure similar to that described for the integrator FIR1. Likewise, by analogy with what was described above for the integrator FIR1, the indicator FIR2 decodes a second reference table TB2 which makes it possible to adjust the gain of the amplifiers AGC1 and AGC2.

The tuner TZ furthermore comprises control means MCM, which may be embodied in hard-wired form or within a microcontroller, for example. The control means MCM is intended for delivering, in particular, the control signal SC making it possible to switch the various multiplexers of the tuner.

Finally, in a conventional manner, the receiver RDS comprises a block DM receiving the two signals I and Q and is capable of performing the subsequent conventional processing operations of demodulation and of channel decoding. Demodulation includes QPSK or 8-PSK demodulation according to terminology well known by one skilled in the art. Channel decoding includes Viterbi decoding, deinterlacing, Reed-Solomon decoding and deshuffling for delivering a stream of packets FM which will be decoded in a source decoding block in accordance with the MPEG standard, for example.

The manner of operation of the tuner according to the invention will now be described in greater detail with reference to FIG. 2. Upon turning on the tuner, or upon a change of channel, the control means MCM positions the multiplexers MUX1, MUX2 and MUX20 to allow a direct connection between the output of the amplifying stage ETA1 and the analog/digital converters. Likewise, the multiplexer MUX4 is positioned to link the block MCL to the adder ADD1.

A tuner initialization phase then begins. At the beginning of this initialization phase, the breaker of the attenuator block ATN is opened by default, activating the attenuator and the gains of the amplifiers AGCA and AGCB are by default fixed at zero. The entire signal received at the input of the signal ES0 is amplified in the amplifier LNA, then attenuated in the stage ETA1. Thereafter, the signal is converted in the analog/digital converters CAN1 and CAN2.

The overall mean power of the signal is then determined as explained above and the output of the filter FIR1, representative of the deviation between this overall mean power and the reference value contained in the register MM1, decodes the table TB1. This thereby brings about the resetting of the gain of the stage ETA1 (steps 20, 21 and 23). In fact, the resetting is performed only if the deviation between this overall mean power and the reference value contained in the register MM1 can be minimized (step 22), given the gain-setting possibilities provided by the stage ETA1.

More precisely, by way of example, if it is assumed that the power of the signal received at the input ES0 is equal to −5 dBm. The power of the signal after amplification in the amplifier LNA having a gain of 15 dB is equal to +10 dBm. After passing through the attenuator ATN and through the amplifiers AGCA and AGCB initially adjusted to have zero gain, the overall mean power of the signal at the output of the stage ETA1 is equal to −10 dBm. This power will be calculated in the digital block and compared with the first reference value which is precisely equal to −10 dBm. In this case, the deviation is zero and consequently is a minimum value. The initialization phase then terminates and the gain and attenuation controls of the stage ETA1 are thus not modified.

If, on the other hand, the power of the signal received at the input ES0 is equal to −20 dBm, the power of the signal at the output of the stage ETA1 is equal to −25 dBm. The calculated deviation between this overall mean power and the first reference value is then equal to −15 dBm. In this case, the means for adjusting the gain of the stage ETA1 can, for example, adjust the gains of the two amplifiers AGCA directly to impart a total gain of 12 dB. This will lead to the obtaining of a signal power at the output of the stage ETA1 equal to −13 dBm. Given the possibilities of stepwise adjustment of the amplifiers AGCA and AGCB, the deviation of −3 dB between this value and the first reference value is regarded as the minimum deviation. The initialization phase is consequently terminated.

As a variation, it will have been possible to perform two successive cycles of adjustment by increasing the gain of the stage ETA1 twice running in steps of 6 dB. At the end of the initialization phase, the tuner reverts to a phase of normal operation, in which the control means MCM deliver a control signal SC positioning the multiplexers on their other path.

In the course of this phase of normal operation, the desired channel (step 24) is selected and the channel power is calculated in a similar manner to that described above in the block MCL (step 25). The channel power is then compared and averaged with the aid of the subtractor ADD2, of the integrator FIR2 and of the second reference value stored in the memory MM2 (step 26).

The decoding of the table TB2 allows finer adjustment of the amplifiers AGC1 and AGC2. It should be noted here that, whereas in this phase of normal operation the gain of the stage ETA1 is fixed, the gain of the amplifiers AGC1 and AGC2 is constantly readjusted (step 28) so long as the calculated deviation is not regarded as a minimum (step 27).

The invention is not limited to the embodiments and modes of implementation described above, but encompasses all variations thereof. Thus, the stage ETA1, although referred to generally as the attenuator/amplifier stage, could be devoid of an attenuator.

That which is claimed is:

1. A process for controlling a tuner having a zero intermediate frequency and comprising an analog circuit, a digital circuit, and an analog/digital conversion stage connected therebetween, the analog circuit comprising a frequency transposition stage and a first controlled-gain amplifier stage connected upstream thereof, the process comprising:
   calculating an overall power of an entire signal having a plurality of channels received by the tuner during a phase of initialization;
   comparing the calculated overall power in the digital circuit with a first reference value corresponding to a desired power at a location in the analog circuit;
   adjusting a gain of the first controlled-gain amplifier stage based upon a deviation between the calculated overall power and the first reference value; and
   selecting one of the plurality of channels during a phase of normal operation after the gain of the first controlled-gain amplifier stage has been adjusted.

2. A process according to claim 1, wherein calculating the overall, power comprises calculating an overall mean power.

3. A process according to claim 1, wherein the desired power at the location in the analog receiver is a maximum power.

4. A process according to claim 1, wherein the gain of the first controlled-gain amplifier stage is adjusted to minimize the deviation between the calculated overall power and the first reference value.

5. A process according to claim 1, wherein the analog circuit further comprises a baseband filter connected to an output of the frequency transposition stage, and a second controlled-gain amplifier stage connected to an output of the baseband filter; and the process further comprising:
   calculating a channel power of the selected channel during the phase of normal operation;
   comparing the calculated channel power with a second reference value corresponding to a desired channel power desired at an input of the analog/digital conversion stage; and
   adjusting a gain of the second controlled-gain amplifier stage based upon a deviation between the calculated channel power and the second reference value.

6. A process according to claim 5, wherein calculating the channel power comprises calculating a mean channel power.

7. A process according to claim 5, wherein the desired channel power at the input of the analog/digital conversion stage is a maximum channel power.

8. A process according to claim 5, wherein the gain of the second controlled-gain amplifier stage is adjusted to minimize the deviation between the calculated channel power and the second reference value.

9. A process according to claim 5, wherein calculating the overall power of the entire signal is based upon a signal available between an output of the first controlled-gain amplifier stage and an input of the frequency transposition stage.

10. A process according to claim 5, wherein calculating the overall power of the entire signal is performed in the digital circuit.

11. A process according to claim 5, wherein the first controlled-gain amplifier stage comprises an attenuator for attenuating the entire signal.

12. A process for controlling a tuner having a zero intermediate frequency and comprising an analog circuit, a digital circuit, and an analog/digital conversion stage connected therebetween, the analog circuit comprising a first controlled-gain amplifier stage and a second controlled-gain amplifier stage with a frequency transposition stage connected therebetween, the process comprising:
   calculating an overall power of an entire signal having a plurality of channels received by the tuner during a phase of initialization;
   adjusting a gain of the first controlled-gain amplifier stage based upon a deviation between the calculated overall power and a first reference value corresponding to a desired power at a location in the analog circuit;
   selecting one of the plurality of channels during a phase of normal operation after the gain of the first controlled-gain amplifier stage has been adjusted;
   calculating a channel power of the selected channel during the phase of normal operation; and
   adjusting a gain of the second controlled-gain amplifier stage based upon a deviation between the calculated channel power and a second reference value corresponding to a desired channel power at an input of the analog/digital conversion stage.

13. A process according to claim 12, wherein calculating the overall power comprises calculating an overall mean power.

14. A process according to claim 12, wherein the desired power at the location in the analog receiver is a maximum power.

15. A process according to claim 12, wherein the gain of the first controlled-gain amplifier stage is adjusted to minimize the deviation between the calculated overall power and the first reference value.

16. A process according to claim 12, wherein adjusting the gain of the first controlled-gain amplifier stage comprises comparing the calculated overall power with the first reference value.

17. A process according to claim 12, wherein calculating the channel power comprises calculating a mean channel power.

18. A process according to claim 12, wherein the desired channel power at the input of the analog/digital conversion stage is a maximum channel power.

19. A process according to claim 12, wherein the gain of the second controlled-gain amplifier stage is adjusted to minimize the deviation between the calculated channel power and the second reference value.

20. A process according to claim 12, wherein adjusting the gain of the second controlled-gain amplifier stage comprises comparing the calculated channel power with the second reference value.

21. A process according to claim 12, wherein calculating the overall power of the entire signal is based upon a signal available between an output of the first controlled-gain amplifier stage and an input of the frequency transposition stage.

22. A process according to claim 12, wherein calculating the overall power of the entire signal is performed iii the digital circuit.

23. A tuner having a zero intermediate frequency and comprising:
an analog circuit comprising
a first controlled-gain amplifier stage having an input for receiving an entire signal having a plurality of channels,
a signal routing circuit having an input for receiving the entire signal from said first controlled-gain amplifier stage, and
a frequency transposition stage connected to a first output of said signal routing circuit;
an analog/digital conversion stage having an input being connected to an output of said frequency transposition stage or to a second output of said signal routing circuit;
a digital circuit connected to said analog/digital conversion stage and comprising a first adjustment circuit for adjusting a gain of said first controlled-gain amplifier stage based upon comparing a calculated overall power of the entire signal with a first reference value corresponding to a desired power at a location in said analog circuit; and
a control circuit connected to said signal routing circuit for connecting the input to the second output thereof for adjusting a deviation between the calculated overall power and the first reference value during a phase of initialization, and for connecting the input to the first output thereof for selecting one of the plurality of channels during a phase of normal operation after the gain of said first controlled-gain amplifier stage has been adjusted.

24. A tuner according to claim 23, wherein the calculated overall power comprises an overall mean power.

25. A tuner according to claim 23, wherein the desired power at the location in the analog receiver is a maximum power.

26. A tuner according to claim 23, wherein the gain of said first controlled-gain amplifier stage is adjusted to minimize the deviation between the calculated overall power and the first reference value.

27. A tuner according to claim 23, wherein said digital circuit further comprises:
a first calculator circuit for providing the calculated overall power; and
a first comparison circuit for comparing the calculated overall power with the first reference value.

28. A tuner according to claim 23, further comprising a baseband filter connected to an output of said frequency transposition stage.

29. A tuner according to claim 23, wherein said analog circuit further comprises a second controlled-gain amplifier stage connected to an output of said frequency transposition stage.

30. A tuner according to claim 29, wherein said digital circuit further comprises a second adjustment circuit for adjusting a gain of said second controlled-gain amplifier stage based upon a deviation between a calculated channel power of a selected channel and a second reference value.

31. A tuner according to claim 30, wherein the calculated channel power comprises a mean channel power.

32. A tuner according to claim 30, wherein the gain of said second controlled-gain amplifier stage is adjusted to minimize the deviation between the calculated channel power and the second reference value.

33. A tuner according to claim 30, wherein said digital circuit further comprises:
a second calculation circuit for providing the calculated channel power during a phase of normal operation; and
a second comparison circuit for comparing the calculated channel power with the second reference value corresponding to a desired channel power at an input of said analog/digital conversion stage.

34. A tuner according to claim 33, wherein the desired channel power is a maximum channel power.

35. A tuner according to claim 23, further comprising a semiconductor substrate such that said analog circuit, said analog/digital conversion stage, and said digital circuit are integrated on said semiconductor substrate.

36. A satellite digital television receiver comprising:
a tuner having a zero intermediate frequency and comprising
an analog circuit comprising
a first controlled-gain amplifier stage having an input for receiving an entire signal having a plurality of channels,
a signal routing circuit having an input for receiving the entire signal from said first controlled-gain amplifier stage, and
a frequency transposition stage connected to a first output of said signal routing circuit;
an analog/digital conversion stage having an input being connected to an output of said frequency transposition stage or to a second output of said signal routing circuit;
a digital circuit connected to said analog/digital conversion stage and comprising a first adjustment circuit for adjusting a gain of said first controlled-gain amplifier stage based upon comparing a calculated overall power of the entire signal with a first reference value corresponding to a desired power at a location in said analog circuit; and
a control circuit connected to said signal routing circuit for connecting the input to the second output thereof for adjusting a deviation between the calculated overall power and the first reference value during a phase of initialization, and for connecting the input to the first output thereof for selecting one of the plurality of channels during a phase of normal operation after the gain of said first controlled-gain amplifier stage has been adjusted.

37. A satellite digital television receiver according to claim 36, wherein the calculated overall power comprises an overall mean power.

38. A satellite digital television receiver according to claim 36, wherein the desired power at the location in the analog receiver is a maximum power.

39. A satellite digital television receiver according to claim 36, wherein the gain of said first controlled-gain amplifier stage is adjusted to minimize the deviation between the calculated overall power and the first reference value.

40. A satellite digital television receiver according to claim 36, wherein said digital circuit further comprises:
   a first calculator circuit for providing the calculated overall power; and
   a first comparison circuit for comparing the calculated overall power with the first reference value.

41. A satellite digital television receiver according to claim 36, further comprising a baseband filter connected to an output of said frequency transposition stage.

42. A satellite digital television receiver according to claim 36, wherein said analog circuit further comprises a second controlled-gain amplifier stage connected to an output of said frequency transposition stage.

43. A satellite digital television receiver according to claim 42, wherein said digital circuit further comprises a second adjustment circuit for adjusting a gain of said second controlled-gain amplifier stage based upon a deviation between a calculated channel power of a selected channel and a second reference value.

44. A satellite digital television receiver according to claim 43, wherein the calculated channel power comprises a mean channel power.

45. A satellite digital television receiver according to claim 43, wherein the gain of said second controlled-gain amplifier stage is adjusted to minimize the deviation between the calculated channel power and the second reference value.

46. A satellite digital television receiver according to claim 43, wherein said digital circuit further comprises:
   a second calculation circuit for providing the calculated channel power during a phase of normal operation; and
   a second comparison circuit for comparing the calculated channel power with the second reference value corresponding to a desired channel power at an input of said analog/digital conversion stage.

47. A satellite digital television receiver according to claim 46, wherein the desired channel power is a maximum channel power.

* * * * *

UNITED STATES PATENT AND TRADEMARK OFFICE
CERTIFICATE OF CORRECTION

PATENT NO. : 7,106,808 B2  
APPLICATION NO. : 09/827306  
DATED : September 12, 2006  
INVENTOR(S) : Busson et al.

Page 1 of 1

It is certified that error appears in the above-identified patent and that said Letters Patent is hereby corrected as shown below:

Column 9, Line 60    Delete: "overall,power"  
                              Insert: -- overall power --

Column 11, Line 29    Delete: " iii the"  
                               Insert: -- in the --

Signed and Sealed this

Third Day of April, 2007

JON W. DUDAS  
*Director of the United States Patent and Trademark Office*